United States Patent [19]

Takahashi

[11] Patent Number: 4,676,580
[45] Date of Patent: Jun. 30, 1987

[54] ADAPTABLE TERMINAL ASSEMBLY FOR MULTI-CONTACT ELECTRICAL CONNECTOR

[75] Inventor: Fumiyuki Takahashi, Tokyo, Japan

[73] Assignee: E. I. Du Pont de Nemours and Company, Wilmington, Del.

[21] Appl. No.: 841,950

[22] Filed: Mar. 20, 1986

[30] Foreign Application Priority Data

Aug. 12, 1985 [JP] Japan ............ 60-122787[U]

[51] Int. Cl.$^4$ ............................................. H01R 4/10
[52] U.S. Cl. ......................................................... 439/885
[58] Field of Search ........................... 339/276 SF

[56] References Cited

U.S. PATENT DOCUMENTS

| | | | |
|---|---|---|---|
| 3,955,877 | 5/1976 | Cobaugh et al. | 339/276 SF X |
| 4,369,572 | 1/1983 | Atkins | 339/276 SF X |
| 4,377,320 | 3/1983 | Weisenburger | 339/276 SF X |
| 4,466,689 | 8/1984 | Davis et al. | 339/276 SF X |

FOREIGN PATENT DOCUMENTS 2813005 10/1978 Fed. Rep. of Germany ...... 339/276 SF

Primary Examiner—Eugene F. Desmond

[57] ABSTRACT

The terminal assembly of this invention has a terminal carrier comprised of a series of integral, same-shape structures whose shape forms a series of widthwise protuberances, arranged at a predetermined pitch, which constitute the respective longitudinal sides of the terminal carrier. A series of contact terminals extend from either side of each of the protuberances along one longitudinal side of the terminal carrier such that they are supported in the widthwise direction and by a pitch determined by that of the protuberances. Lozenge-shaped through holes are formed in the center of each of the same-shape structures at the point of intersection between an imaginary latitudinal and longitudinal axis. The individual same-shape structures and the terminal carrier as a whole are symmetrical with respect to these axes. Those protuberances constituting that side of the terminal carrier from which the terminals extend are the first protuberances, while those that constitute the carrier's opposite side are the second protuberances.

1 Claim, 6 Drawing Figures

ADAPTABLE TERMINAL ASSEMBLY FOR MULTI-CONTACT ELECTRICAL CONNECTOR

BACKGROUND OF THE INVENTION

The present invention relates to a terminal assembly consisting of a row of terminals supported at a predetermined pitch, in the widthwise direction, along one lengthwise side of a belt-like terminal carrier. A terminal assembly of this type, used, for example, to manufacture a multi-contact electrical connector, is generally formed by punching out, at a predetermined pitch and in the widthwise direction, non-required portions of a belt-like conductive substrate, leaving a lengthwise region on one side of the substrate substantially intact while forming, as a result of the punching process, contact terminals integral with and extending widthwise from the intact region.

In assembling a multi-contact electrical connector, the contact terminals of the terminal assembly are simultaneously set in the housing of a connector while they are supported by a terminal carrier. Once set, the terminals are then separated from the terminal carrier. This particular method of assembly has proven more efficient than that wherein the terminals are separated from and then set in the housing of the connector independently of their supporting terminal carrier and is therefore widely accepted. This conventional assembly process, however, necessitates that, even if the terminals are of the same shape, when it is necessary to fabricate two types of connectors with terminal pitches of 2.0 mm and 2.54 mm, separate terminal assemblies must be prepared to accommodate the different pitches. This problem is common in terminal assemblies for IC pins (IC LEG), IC socket terminals, and other terminals such as those sold under the trademark Griplet by the assignee of the present invention.

SUMMARY OF THE INVENTION

It is an object of the present invention to provide a terminal assembly having a variable terminal pitch. To attain this object, the present invention provides a terminal assembly whose narrow, belt-like terminal carrier is a series of integral, same-shape structures, the longitudinal sides of which are a series of width-wise protuberances arranged at a predetermined pitch along and, in fact, constituting the opposite longitudinal sides of the terminal carrier. Through holes are formed in the center of each of the same-shape structures. A series of terminals extend from either side of each of the protuberances along one side of the terminal carrier such that they are supported by the carrier in the widthwise direction and by a pitch determined by that of the protuberances. Those protuberances constituting that side of the carrier from which the terminals extend are the first protuberances and those protuberances along the opposite lengthwise side are the second protuberances.

DETAILED DESCRIPTION OF THE PREFERRED EMBODIMENTS

Description may now be made, with reference to the accompanying drawings, of the embodiment of this invention: an adaptable terminal assembly that can be used in the fabrication of a multi-contact electrical connector.

Figure 1:
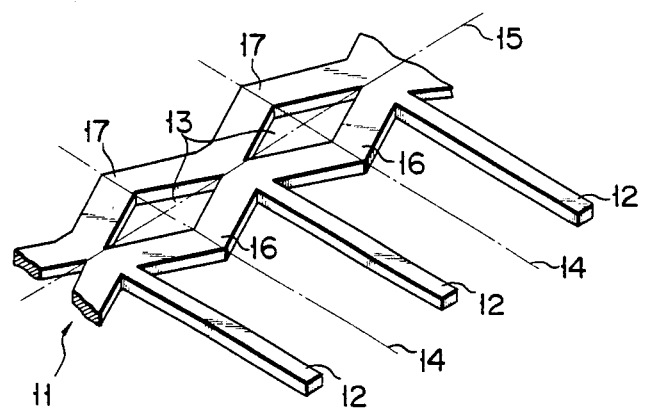
FIG. 1 is an external oblique view of the terminal assembly embodying this invention.
Figure 2:
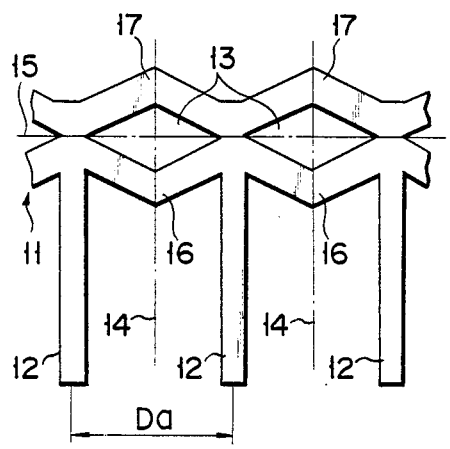
FIG. 2 is a plan view of the terminal assembly of FIG. 1.

FIG. 1 is an external view of the subject terminal assembly. FIG. 2 is a plan view of the terminal assembly of FIG. 1. The terminal assembly comprises narrow, belt-like terminal carrier 11 which, prepared from a single conductive metal plate, is composed of a series of integral, diamond-shaped structures with four equal sides and two obtuse angles whose points form a series of slight, widthwise projections or protuberances arranged at a predetermined pitch Da along and, in fact, constituting the opposite longitudinal sides of terminal carrier 11. A series of contact terminals, contactterminals 12, extend from either side of each of the projections along one longitudinal side of terminal carrier 11 such that they are supported by carrier 11 in the widthwise direction and by a pitch of Da which is determined by pitch Da of the projections, lozengeshaped through holes 13, whose obtuse angles are aligned with those of the diamond-shaped structures, are formed, at a pitch corresponding to pitch Da of terminals 12, in the center of each diamond-shaped structure at the point of intersection between imaginary latitudinal axes 14, drawn across the width of terminal carrier 11 such that they bisect the obtuse angles of each of the structures, and imaginary longitudinal axis 15 which is drawn longitudinally through the middle of belt-like terminal carrier 11. In this way, the symmetry of each diamondshaped structure and, moreover, the terminal carrier as a whole, is assured. Those projections constituting that side of carrier 11 from which terminals 12 extend are the first projections and, in this embodiment, are denoted by reference number 16. Those projections constituting the opposite side of carrier 11 are the second projections and, in this embodiment, are denoted by the number 17.

Figure 3:
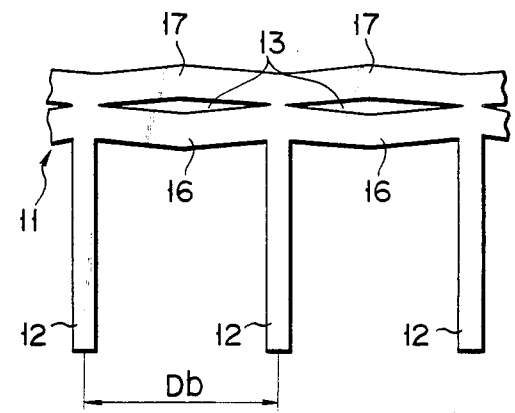
FIG. 3 is a plan view, corresponding to FIG. 2, which indicates the terminal assembly wherein the terminal pitch has been changed from that shown in FIG. 2.

Description may now be made, with reference to the plan view of FIG. 3, of how it is that the contact terminals constituting a part of the terminal assembly constructed as described above are adapted to provide a multi-contact electric connector (not shown) wherein the terminals are arranged at a pitch of Db. For the purpose of increasing the pitch between terminals 12 from Da to Db, a substantially equal force is applied to projections 16 and 17 through means of a simple device (not shown). In this manner the obtuse angles of each of the diamond-shaped structures are straightened, what with the force applied to projections 16 and 17 pressing the respective sides of the diamond-shaped structures together to thereby close lozenge-shaped through hole 13. As a result, the pitch of respective contact terminals 12 is increased by $\Delta D$ from Da to Db.

Variations in the pitch of terminals 12 are directly related to the extent to which the obtuse angles forming projections 16 and 17 are deformed. Let it be assumed that the symbol La represents the peripheral length of lozenge-shaped through hole 13, and that the symbol Lb denotes the length of axis line 15 from one point of its bisection of an angle of hole 13 to another. Using these two symbols, the maximum value, $\Delta D_{max}$, of said ΔD factor can be represented as (La/2)−Lb. Implied here is that the pitch of contact terminals 12 of the terminal assembly of FIGS. 1 and 2 can be varied within the range of from Da to Da+ΔDmax dependent upon the extent to which the diamond-shaped structures are deformed. For this reason, the terminal assembly embodying this invention can be adapted to provide various types of electrical connectors wherein the terminal pitch varies within the range between Da and Da+ΔDmax, without, moreover, the need of having to previously separate contact terminals 12 from terminal carrier 11 in advance of setting them in the housing of a connector.

Figure 4A:
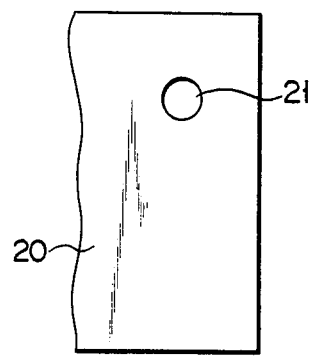
FIGS. 4a to 4c illustrate the sequential steps of manufacturing the terminal assembly of FIGS. 1 and 2.
Figure 4B:
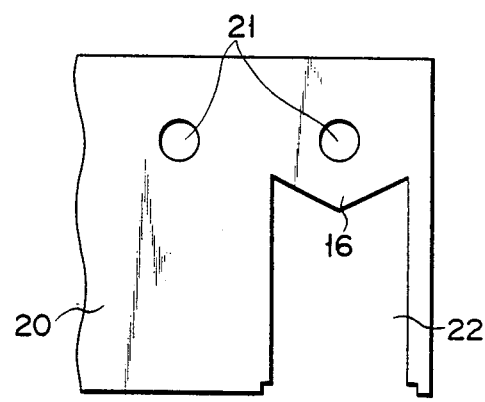
Figure 4C:
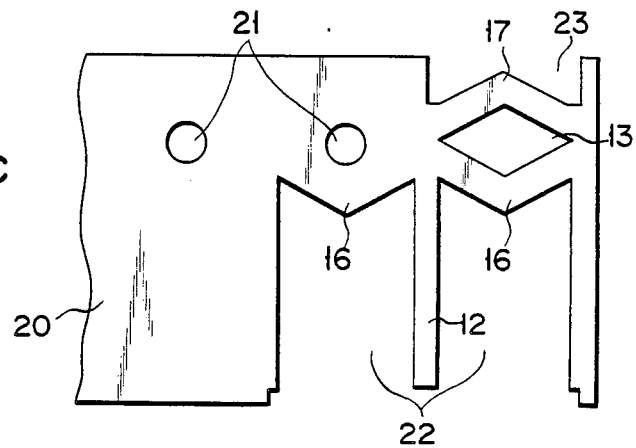

A brief description of the method of manufacturing the terminal assembly of this embodiment will, with reference to FIGS. 4a through 4c, now be made.

The leading end of belt-like conductive metal plate 20 is fed into a progressive die (not shown) by a feeder (not shown) at a prescribed pitch substantially equal to that of contact terminal 12 pitch Da. In the first stage of the progressive die operation, pilot hole 21 is formed at one side of plate 20, as shown in FIG. 4a. Pilot hole 21 is used as a locating means to compensate for errors in the pitch at which the feeder carries plate 20 forward.

As shown in FIG. 4b, in the second stage of the progressive die operation, a portion of metal plate 20, portion 22, which lies under pilot hole 21, is punched out to leave the contour of the first of what, in FIGS. 1 and 2, are projections 16 and contact terminals 12.

In the third stage of the progressive die operation, that portion of plate 20, portion 23 as shown in FIG. 4c, which lies above pilot hole 21, is punched out to define the first of what, in FIGS. 1 and 2, are projections 17. In the third stage of progressive die operation, a lozenge-shaped portion surrounding pilot hole 21 is punched out of metal plate 20 to provide hole 13. Upon completion of all three of the progressive die stages for each section of metal plate 20 fed through the progressive die at prescribed pitch Da, the terminal assembly illustrated in FIGS. 1 and 2 is produced.

This invention is not limited to the embodiment described above; various modifications can be made without departing from the scope and object of the invention. For instance, the invention is applicable to terminal assemblies for manufacturing not only electrical connectors but also IC pins (IC LEG), IC socket terminals and other terminals such as those sold under the trademark Griplet. The shape of through hole 13 need not be limited to that of a lozenge, but may, instead, be, for example, that of an ellipses. Regardless of shape, however, it is preferred that the width of through hole 13, as measured in the widthwise direction of terminal carrier 11, be greatest near the central portion of the hole, that portion defined by the intersection of imaginary axes 14 and 15. Modifications to the shape of the sides of the device are also permissible. Rather than being angular, the sides could, for example, just as well be arcuate.

What is claimed is:

1. A terminal assembly capable of varying the pitch of its terminals comprising:
   a narrow, belt-like terminal carrier;
   a plurality of terminals disposed on and extending from one side of the terminal carrier at an initial predetermined pitch Da; and
   a plurality of lozenge-shaped openings formed along the terminal carrier, each said lozenge-shaped opening disposed between every pair of said terminals, each said lozenge-shaped opening being defined by a diamond-shaped structure having four integral legs of equal length, said
   legs forming two facing obtuse angles along opposed sides of said terminal carrier, said obtuse angles forming a series of points along said terminal carrier having an initial predetermined pitch Da; whereby closing the lozenge-shaped openings and thereby lengthening the diamond-shaped structures increases the pitch of said points and the pitch of said terminals by a predetermined amount to a final pitch of Db.

* * * * *